United States Patent [19]

Falletti

[11] Patent Number: 5,165,971
[45] Date of Patent: Nov. 24, 1992

[54] ACTIVATING COMPOSITION FOR PLATING OF ELECTRICALLY INSULATIVE SUBSTRATES AND METHOD FOR PLATING OF SUCH SUBSTRATES USING SAID COMPOSITION

[75] Inventor: Leonardo Falletti, Turin, Italy

[73] Assignee: Kemifar S.p.A., Italy

[21] Appl. No.: 346,913

[22] Filed: May 3, 1989

[30] Foreign Application Priority Data

Feb. 3, 1989 [IT] Italy .................. 67063 A/89

[51] Int. Cl.$^5$ ............................................. C23C 26/00
[52] U.S. Cl. .................. 427/443.1; 427/304; 427/305; 427/306
[58] Field of Search .................. 546/2, 1 D; 106/1.11; 556/137; 427/443.1, 304, 306, 305

[56] References Cited

U.S. PATENT DOCUMENTS

| | | | |
|---|---|---|---|
| 2,876,177 | 3/1959 | Gundel | 204/49 |
| 3,708,329 | 1/1973 | Schoenberg | 427/306 |
| 3,862,019 | 1/1975 | Rosenberg | 204/49 |
| 3,940,320 | 2/1976 | Kardos | 204/52.1 |
| 4,082,899 | 4/1978 | Feldstein | 427/304 |
| 4,087,586 | 5/1978 | Feldstein | 427/304 |
| 4,180,600 | 12/1979 | Feldstein | 427/306 |
| 4,220,678 | 9/1980 | Feldstein | 427/306 |
| 4,248,632 | 2/1981 | Ehrich | 204/30 |
| 4,301,196 | 11/1981 | McCormack | 427/443.1 |

FOREIGN PATENT DOCUMENTS

| | | | |
|---|---|---|---|
| 026133 | 3/1974 | Japan. | |
| 1394164 | 5/1975 | United Kingdom | 427/306 |

*Primary Examiner*—Shrive Beck
*Assistant Examiner*—Vi Duong Dang
*Attorney, Agent, or Firm*—Richard P. Mueller

[57] ABSTRACT

The invention relates to an activating composition for the electroless plating of non-conductive surfaces, in particular electronic printed circuit boards.

The composition contains a metal complex in which the ligand consists of a quaternary nitrogen compound, especially a compound in which nitrogen forms part of a heterocyclic system and is quaternarized with a radical comprising an acid residue carrying a negative charge, for example a sulphonated group.

The invention also concerns a method for the electroless plating involving the use of such composition, preceded by a preliminary treatment of the substrate and followed by the reduction of activating metal.

The activating composition according to the invention allows to fix firmly the activator metal to the substrate.

5 Claims, No Drawings

ACTIVATING COMPOSITION FOR PLATING OF ELECTRICALLY INSULATIVE SUBSTRATES AND METHOD FOR PLATING OF SUCH SUBSTRATES USING SAID COMPOSITION

BACKGROUND OF THE INVENTION

The present invention relates to an activating composition for the plating of electrically insulative substrates and to a method for the plating of such substrates using said composition.

From the U.S. Pat. No. 4,248,632 is known a method for the metallization of non-conductive surfaces of organic polymers, based on the use of an activating solution containing a complex of a metal of the First or Eighth Subgroup of the Periodic Table of Elements, with an N-containing compound such as ammonia or a primary, secondary or tertiary amine, especially 2-aminopyridine.

That solution, prepared with an acidic to neutral pH, is applied onto the surface of the piece to be treated, which must be dipped subsequently in a reducing bath in order to reduce the complexed metal and deposit it onto the same surface, for its activation in view of the subsequent chemical metallization for reduction, or electroless reduction.

Pyridine complexes with various transition metals for the preparation of activating solutions to be used in the electroless plating of non-conductive surfaces, are also described in U.S. Pat. No. 3,523,874, whereas U.S. Pat. No. 4,734,299 describes complexes substantially of the same metals with amides.

The plating method comprises various steps, in each of which the non-conductive substrate is subjected to a treatment with chemical or physical agents.

After reach treatment, a washing is usually performed, to avoid the contamination of the subsequent bath with the solution of the previous one.

The known methods involve, in general, the disadvantage consisting in the easy removal of the activating solution from the substrate during the washing operation, due to the low adhesion of metal-amine or amide complex to the surface to be activated. Consequently, a few catalyst remains onto the substrate, and subsequent metallization for reduction is not adequately activated.

Purpose of the present invention is to eliminate or reduce the disadvantages of the known art, and in particular to provide an activating composition able to firmly adhere on the substrate surface to be metallized, pretreated with a step of a method also forming an object of the invention and ending with the electroless plating of the substrate.

SUMMARY OF THE INVENTION

One first object of the invention consists of an activating composition for the electroless plating of non-conductive substrates, characterized in that it comprises, as an activating substance, an effective amount of a complex having the general formula (I)

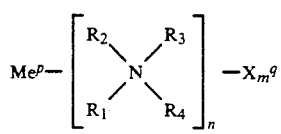

(I)

wherein:

Me is a metal selected from the group consisting of silver, gold, palladium, platinum, copper, nickel, iridium, rhodium; $R_1$, $R_2$, $R_3$, $R_4$ are alkyl, aryl, alkylaryl, arylalkyl, cycloaliphatic, heterocyclic radicals, both singly or in combination;

n is an integer ranging from 1 to 6;

p represents the oxidation number of the metal;

X is an organic or inorganic acid residue;

q represents the charge of the anion X;

m is an index given by $m=(p+n)/q$ $R_4$ can also be equal to R—Ac, wherein R is an aliphatic radical and Ac is a residue of an organic or inorganic acid with a negative charge, with the provision that in this case is $m=p/q$.

It is evident from the foregoing definition, that the ligand of the metal is a molecule containing an atom of quaternary nitrogen, and therefore a molecule with positive charge, balanced either by the anion X or by a negative charge present in one of the radicals bound to the quaternary nitrogen. The acid residue Ac carrying a negative charge preferred is the sulphonic group $SO_3-$. In that case, the ligand becomes a dipolar ion (Zwitterion) that does not need external acid residues for the electrical balancement of the molecule.

A preferred class of ligands containing an atom of quaternary nitrogen consists of heterocyclic compounds, i.e. compounds coming within the scope of the general formula I, but wherein the $R_1$, $R_2$ and $R_3$ radicals belong to a simple or condensed heterocyclic ring, as given by the formula (II):

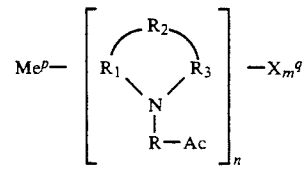

wherein:

Me is a metal as previously defined;

$R_1$, $R_2$, $R_3$ make part of a simple or condensed ring heterocyclic system;

R, X, n, p and q are as previously defined;

Ac is an acid residue with a negative charge;

m is an index given by $m=p/q$.

Examples of such molecules are 1-(3-sulfopropyl)-pyridine, 1-(3-sulfopropyl)-2-aminopyridine, 1-(3-sulfopropyl)-2-vinylpyridine, 1-(3-sulfopropyl)-2-methylpyridine, 1-(3-sulfopropyl)-4-benzylpyridine, 3-pyridin-1-(3-sulfopropyl)aldehyde, 1-(3-sulfopropyl)-2,6-diaminopyridine, 1-(3-sulfopropyl)-5,7-dibromo-8-hydroxyquinoline, 1-(3-sulfopropyl) -5,7-dichloro-8-hydroxyquinoline, 1-(3-sulfopropyl)-2-methyl-5,7-dichloro-8-hydroxyquinoline, 1-(3-sulfopropyl)-8-hydroxiquinaldine, 1-(3-sulfopropyl)-2,2-dipyridine, 1-(3-sulfopropyl)phenanthroline.

Such molecules, due to the positive charge of the quaternary nitrogen atom, are able to bind permanently to the substrate, to which, before its treatment With the activating composition, has given a negative charge, as later described.

Preferred examples of acid residues X are the inorganic anions, as chloride, bromide, iodide, chlorate, nitrate, sulphate, phosphate, or organic anions such as acetate, formiate, oxalate.

A further object of the invention consists of a method of electroless plating of non-conductive substrates, characterized in that it comprises the steps of:

pretreating the substrate with a composition including a surfactant and a complexing agent;

applying to the substrate an activating composition including the complex of general formula (I);

reducing the metal of the complex of formula (I) on the substrate surface, by treating it with reducing solution;

subjecting the substrate to the electroless plating by means of a treatment with a solution of a copper salt.

The substrate on which the treatment of metallization according to the invention is usually performed consists of electronic circuit base boards, made of non-conductive materials such as ABS resins, propylene, epoxy, phenol, polyamide and fluorocarbon resins, possibly charged.

The pretreatment of the substrate has for object to clean it from the residues of the mechanical processings previously performed, such the drilling, and to give to the substrate itself a stable negative charge, able to aid the surface adsorption of the reduction catalyst, applied in the following step of activation.

The surfactant agent used in the pretreatment step of the substrate can be an anionic or non-ionic surfactant, or a mixture of such surfactants, preferably with amphoteric characteristics.

Complexing agent is selected from the inorganic anions or the organic molecules provided of chelating groups. Examples of such products are phosphates and silicates of alkaline metals, EDTA, NTA, ethanolamine.

The solution can be either acid or basic. The basic solutions have degreasing and chelating effect higher than that of acid solutions; but the last are preferred when a pickling effect is desired.

The second step of the process has as object to apply onto the substrate, to which a negative charge is given, the activator of the final plating treatment. Therefore, the activating metallic ion is complexed with an organic ligand positively charged, such as a quaternary nitrogen compound as defined according to the general formula (I) or preferably by the general formula (II).

The composition is in the form of aqueous solution, and is stable even at alkaline pH. Therefore, it can be applied without needing the acidity conditions typical of some activating composition of the known art, which can be corrosive.

The metal is present in the solution at a concentration ranging from 1 to 5,000 ppm.

The molar ratio of metal to ligand depends essentially on coordination number of the metal and the number of attack points in the case of this last is multidentate. Said ratio ranges from 1:1 to 1:6.

Temperature of the solution for the application to the substrate is not critical, but it preferably ranges from room temperature to 60° C.

Metal reduction for the complex of formula (I) is performed in a known manner, with inorganic or organic reductive agents, at room temperature.

The substrate thus activated is finally subjected to electroless plating for chemical reduction of the metal that is desired to deposit on the substrate - copper, generally - from its solution.

Each of the process steps is usually followed by a rinse with water, before passing to subsequent step.

Treatments of various steps are obtained preferably by dipping the substrate in the bath containing the required composition.

PREFERRED EMBODIMENTS

Following examples are illustrative, but non limitative, of the invention embodiments.

A. Preparation of the Complex of General Formula (II)

Example 1

Preparation of a solution of tetrakis [1-(3-sulfopropyl)-2-aminopyridine]palladium (II) chloride 250 mg of palladium in the form of $NaPdCl_4$ are reacted under stirring with 1-(3-sulfopropyl)-2-aminopyridine in water, in a molar ratio ranging from 1 to 4, at 50° C., for 20 minutes.

Solution is allowed to cool and stand for two hours.

Example 2

Preparation of a solution of tetrakis [1-(3-sulfopropyl)pyridine] palladium (II) chloride.

250 mg of palladium in the form of $PdCl_2$ are reacted under stirring with 1-(3-sulfopropyl)pyridine, in a molar ratio from 1 to 4, at 50° for 20 minutes, in 500 ml of water and 500 ml of ethyl alcohol.

Solution is allowed to cool and stand for two hours.

Example 3

Preparation of a solution of tetrakis [1-(3-sulfopropyl)-2-vinylpyridine]platinum (II) chloride.

150 mg of platinum in the form of $K_2PtCl_4$ are reacted with 1-(3-sulfopropyl)-2-vinylpyridine, in a molar ratio from 1 to 6, i.e. with ligand in excess, in a mixture of 500 ml of water and 500 ml of cellosolve, at 50° C. under stirring for 20 minutes.

Example 4

Preparation of a solution of bis [1-(3-sulfopropyl)-2-methylpyridine]copper (i) chloride 350 mg of copper in the form of CuCl are reacted with 1-(3-sulfopropyl)-2-methylpyridine in a molar ratio from 1 to 2, under stirring, in water, for 20 minutes at 50° C.

Solution is left standing for one hour.

Example 5

Preparation of a solution of bis [1-(3-sulfopropyl)-2,6-diaminopyridine]gold (III) chloride 400 mg of gold in the form of $AuCl_3$ are reacted with 1-(3-sulfopropyl)-2,6-diaminopyridine in a molar ratio of 1:2 under stirring in water for 20 minutes at 50° C.

Solution is allowed to cool and stand for one hour.

Example 6

Preparation of a solution of [1-(3-sulfopropyl)-2,2'-dipyridine]palladium (II) chloride.

250 mg of palladium in the form of $K_2PdCl_4$ are reacted with 1-(3-sulfopropyl)-2,2'-dipyridine in a molar ratio of 1:4 in water at 50° C. under stirring for 20 minutes.

Solution is allowed to cool and stand for 1-2 hours.

Example 7

Preparation of a solution of [1-(3-sulfopropyl)-2,2'-dipyridine]copper (I)-palladium (II) chloride.

250 mg of palladium in the form of $PdCl_2$ and 350 mg of copper in the form of CuCl are reacted with 1-(3-sulfopropyl)-2,2'-dipyridine in a molar ratio of 1:2 compared with entire quantity of metal so as to form a mixed complex Cu-Pd. Reactants are dissolved in water and maintained under stirring for 20 minutes at 30° C.

Solution is allowed to cool and stand for about 1 hour.

Example 8

Preparation of a solution of bis [1-(3-sulfopropyl)pyridine]nickel (II) chloride.

500 mg of nickel in the form of $NiCl_2$ are reacted with 1-(3-sulfopropyl) pyridine in a molar ratio of 1:2 under stirring in water for 20 minutes at 30° C.

Solution is allowed to cool and stand for 1-2 hours.

Example 9

Preparation of [1-(3-sulfopropyl)-phenanthroline]palladium (II) chloride.

500 mg of Pd in the form of $PdCl_2$ are reacted with 1-(3-sulfopropyl-phenanthroline in a molar ratio of 1:4 under stirring in mixture of water and dimethylformamide in equal parts for 20 minutes at room temperature under stirring.

Solution is allowed to cool and stand for 1-2 hours.

B. Preparation of the Solution for Pretreatment of the Substrate

Example 10

An aqueous solution containing 50 g/l of sodium hydroxide, 30 g/l of sodium silicate, 20 g/l of sodium gluconate, 5 g/l of sodium tripolyphosphate is prepared. To this solution are added 50 g of an amphoteric surfactant made of a derivative of the lauric acid amide, traded with the mark Miranol H2M Conc. by Miranol Chemical Co., and 10 g/l of polyethylene glycol of molecular weight 4,000.

Said solution is warmed at 70° C., afterwards the substrate is dipped in it for about 3 minutes.

Example 11

Alternatively to the composition of example 10, the pretreatment of the substrate can be performed with an aqueous solution containing 50 ml/l of triethanolamine, 25 ml/l of monoethanolamine, 25 g/l of tetrasodic salt of EDTA as complexing agent.

To this solution are added 50 g/l of the amphoteric surfactant of example 10.

Said solution is warmed at 70° C., afterwards the substrate is dipped in it for about 5 minutes.

Example 12

Alternatively to the foregoing compositions, the pretreatment of the substrate can be performed with an aqueous solution containing 50 g/l of phosphoric acid, 100 g/l of sulfuric acid, 25 g/l of an amphoteric surfactant, derived from the oleic acid amide, such as the surfactant traded with the mark Miranol OM-SF Conc. by Miranol Chemical Co., and 10 g/l of an anionic surfactant, such as sodium alkylnaphtalenesulphonate.

Said solution is warmed at 70° C., afterwards the substrate is dipped in it for about 3 minutes.

Example 13

Alternatively to the foregoing compositions, the pretreatment of the substrate can be performed with an aqueous solution containing 100 g/l of sulphamic acid, 20 g/l of hydrochloric acid, 50 g/l of monochloroacetic acid, 25 g/l of the amphoteric surfactant as defined in example 12, and 25 g/l of a non-ionic surfactant, such as a surfactant made for condensation of 1 mol of nonylphenol with 9 mols of ethylene oxide.

Said solution is warmed at 70° C., afterwards the substrate is dipped in it for about 3 minutes.

Treatment of the Substrate with the Activating Composition

Example 14

Solution prepared according to example 1 is warmed at 35° C., there is dipped the substrate deriving from the pretreatment, after rinsing with water, and it is maintained in the solution for about 6 minutes.

Example 15

Substrate deriving from the pretreatment is dipped, after rinsing with water, in the solution prepared according to example 2 at room temperature for about 6 minutes.

Example 16

Substrate deriving from the pretreatment is dipped, after rinsing with water, in the solution obtained according to example 3 at 30° C. for 4 minutes.

Example 17

Substrate deriving from the pretreatment is rinsed with water and then dipped in the solution obtained according to example 4 and there maintained for 6 minutes at 30° C.

Example 18

Substrate deriving from the pretreatment is rinsed with water and dipped in the solution obtained according to example 5 at room temperature for about 6 minutes.

Example 19

Substrate deriving from the pretreatment is rinsed with water and dipped in the solution obtained according to example 6 for 6 minutes at 40° C.

Example 20

Substrate deriving from the pretreatment is rinsed with water and dipped in the solution obtained according to example 7 and there maintained for 6 minutes at 40° C.

Example 21

Substrate deriving from the pretreatment is rinsed with water and dipped in the solution obtained according to example 8 and there maintained for 6 minutes at 40° C.

Substrate deriving from the pretreatment is rinsed with water and dipped in the solution obtained according to example 9 and there maintained for 6 minutes at room temperature.

D. Reduction of the Activating Composition

Example 23

After rinsing with water, substrate onto which has been adsorbed the complex obtained in the activating solution is subjected to reduction in a bath containing 5 g/l of sodium hypophosphite in an aqueous solution basified at pH 12 with sodium hydroxide, at temperature of 40° C. for 5 minutes, giving the reduction of metal onto the substrate surface, evidenced by the color change from pale yellow to grey.

Example 24

Reduction is performed as in the example 23, but employing as reducing agent a solution containing 10 g/l of sodium borohydride basified at pH 14 with sodium hydroxide.

Example 25

Reduction is performed as in the example 23, but employing as reducing agent a solution containing 10 g/l of dimethylaminoborane. Reduction temperature is 30° C.; time is 5 minutes.

Example 26

Reduction is performed as in the example 23, but employing as reducing agent an aqueous solution obtained by dissolving 25 ml of 40% aqueous solution of formaldehyde in 1 liter water and adjusting pH at 14 with sodium hydroxide.

Example 27

Reduction is performed as in the example 23, but employing as reducing agent a solution of hydrazine hydrate in water. Reduction is performed at room temperature for 5 minutes.

E. Electroless Plating of the Substrate

Example 28

Substrate deriving from the foregoing treatment, after rinsing with water, is dipped in a bath containing cupric ion in a concentration of 2 g/l, 20 g/l of EDTA, 8 g/l of formaldehyde and 10 g/l of sodium hydroxide at a temperature of 50° C. for 20 minutes. Uniform coating of copper on whole substrate surface is obtained.

I claim:

1. A method of electroless plating of non-conductive substrates, characterized in that it comprises the steps of:
    pretreating the substrate with a composition including a surfactant and a complexing agent;
    applying to the substrate an activating composition including the complex of general formula (I)

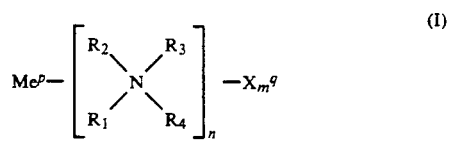

wherein:
Me is a metal selected from the group consisting of silver, gold, palladium, platinum, copper, nickel, iridium, rhodium; $R_1$; $R_2$; $R_3$; $R_4$ are alkyl, aryl, alkylaryl, arylalkyl, cycloaliphatic, heterocyclic radicals, both singly or in combination;
D is an integer ranging from 1 to 6;
p represents the oxidation number of the metal;
X is the anion of an organic or inorganic acid;
g represents the charge of the anion X;
m is an index given by $m=(p+n)/q$;
$R_4$ can also be equal to R—Ac, wherein R is an aliphatic radical and Ac is the residue of an organic or inorganic acid with a negative charge, with the provision that in this case $m=p/q$;
reducing the metal of the complex of formula (I) on the substrate surface, by treating it with reducing solution;
subjecting the substrate to electroless plating by means of a treatment with a solution of a copper salt.

2. A method according to claim 1, characterized in that the activating composition includes a complex of general formula (II)

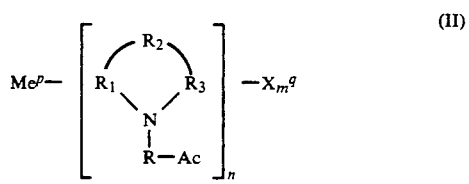

wherein
Me is a metal as defined in claim 1;
$R_1$, $R_2$, $R_3$ make part of a simple or condensed ring heterocyclic system;
x is the anion of an organic acid as defined in claim 1;
n, p and q are as defined in claim 1;
Ac is an acid residue with a negative charge;
R is an aliphatic radical;
m is an index given by $m=p/q$.

3. A method according to claim 1, characterized in that the activating composition is a solution in which the metal Me is present at concentration from 1 to 5,000 ppm.

4. A method according to claim 1, characterized in that the surfactant used in the step of pretreatment of the substrate is an amphoteric surfactant.

5. A method according to claim 1, characterized in that the activating composition is applied in basic solution.

* * * * *